United States Patent
Gu et al.

(10) Patent No.: US 6,806,038 B2
(45) Date of Patent: Oct. 19, 2004

(54) PLASMA PASSIVATION

(75) Inventors: Shiqun Gu, Vancouver, WA (US); Hong Lin, Vancouver, WA (US); Ryan Tadashi Fujimoto, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 148 days.

(21) Appl. No.: 10/190,954

(22) Filed: Jul. 8, 2002

(65) Prior Publication Data

US 2004/0005517 A1 Jan. 8, 2004

(51) Int. Cl.$^7$ .................................... G03F 7/00
(52) U.S. Cl. ............... 430/318; 430/323; 430/322; 430/329; 430/330; 216/58; 216/63; 216/67; 216/69
(58) Field of Search ................. 430/318, 323, 430/322, 329, 330; 216/58, 63, 67, 69

(56) References Cited

U.S. PATENT DOCUMENTS

2002/0072016 A1 * 6/2002 Chen et al. ................ 430/323

* cited by examiner

*Primary Examiner*—John A. McPherson
*Assistant Examiner*—Daborah Chacko-Davis
(74) *Attorney, Agent, or Firm*—Luedeka, Neely & Graham, P.C.

(57) ABSTRACT

A method for forming a conductive trace on a substrate. The conductive trace is patterned with a photoresist mask and etched, thereby forming a polymer layer on a top surface and sidewalls of the photoresist mask and on sidewalls of the conductive trace. The polymer layer contains entrained chlorine gas. The substrate is heated on a chuck in a reaction chamber. A remote plasma is generated from ammonia gas and oxygen gas. The substrate is contacted with the ammonia and oxygen plasma, thereby withdrawing a substantial portion of the entrained chlorine gas from the polymer layer. A radio frequency potential is applied to the chuck on which the substrate resides, thereby creating a reactive ion etchant from the ammonia and oxygen plasma in the reaction chamber and removing the polymer layer from the top surface of the photoresist mask. The photoresist mask is thus exposed, and then removed in an ashing process.

16 Claims, 1 Drawing Sheet

PLASMA PASSIVATION

FIELD

This invention relates to the field of integrated circuit processing. More particularly, this invention relates to removing a photoresist mask following a metal etching process.

BACKGROUND

Integrated circuits are typically electrically interconnected via electrically conductive traces, such as metal lines. Aluminum has been an often used component in such conductive traces because of its low cost and good conductivity. Typically, other metals and metallic compounds are deposited in conjunction with an aluminum layer to form a conductive stack of layers that are patterned to form the conductive traces. For example, a typical conductive stack may include layers of materials such as titanium, titanium nitride, aluminum, and copper. Because the conductive stack is often primarily formed of aluminum, it is sometimes referred to hereinafter as the aluminum layer. However, it is appreciated that there are typically other metal and metal compound layers formed with the aluminum layer.

In a typical process for forming the aluminum traces, a photoresist mask is patterned on the aluminum layer, with photoresist remaining on those portions of the aluminum layer that are to form the conductive traces, and the photoresist removed from those portions of the aluminum layer that are to be removed. Once patterned, the aluminum layer is etched, such as with chlorine ($Cl_2$) and boron trichloride ($BCl_3$) gasses in a reactive ion etch. Once the aluminum layer is etched, it is desirable to remove the photoresist mask so that subsequent processing can be accomplished. The photoresist mask is typically removed in an oxygen gas plasma, in which the photoresist mask is oxidized. This process is commonly referred to as ashing.

However, during the etch process, a polymer layer is typically formed around the exposed surfaces of the photoresist mask and the sidewalls of the aluminum traces. The polymer layer includes reaction products from the etching process, such as carbon, aluminum, oxygen, chlorine, nitrogen, silicon, titanium, and some amount of entrained chlorine gas. Unfortunately, the polymer layer tends to reduce the effectiveness of the ashing process, because it tends to shield the photoresist layer from the oxygen plasma.

Therefore, an intermediate process is typically performed between the etching process and the ashing processing. The goals of the intermediate process are to modify the polymer layer so that the photoresist layer is more easily removed during the subsequent ashing process, and to ensure that the sidewalls of the aluminum layer are sufficiently passivated. This intermediate process is often referred to as a passivation process.

During the passivation process, a microwave water vapor plasma is formed and introduced into the reaction chamber, wherein resides the substrate on which the aluminum traces have been formed. The water vapor plasma softens the polymer layer that coats the photoresist mask and the sidewalls of the aluminum traces, and tends to remove most of the entrained chlorine gas from the polymer layer. The substrate is typically heated on a chuck during the passivation process, to aid in the removal of the entrained chlorine gas. Some amount of the photoresist layer may also be removed in the passivation process.

However, this passivation process only softens and does not completely remove the polymer layer, and thus the subsequent ashing process tends to not be completely effective in removing the photoresist layer, unless an excessively long ashing process is used. Such an excessively lengthy ashing process tends to reduce the throughput of the ashing process, and thus tends to increase costs. Furthermore, the passivation process also tends to introduce other problems.

For example, sometimes the water vapor condenses in the vapor delivery line and is not completely dissociated in the upstream microwave plasma, and water reaches the polymer layer. The water then tends to react with the entrained chlorine gas in the polymer layer to form a highly corrosive solution that attacks and degrades the aluminum traces. Further, the thermal energy from the block heater on which the substrate is disposed tends to cause the polymer layer to form a crust on its outside layer. The crust tends to be more resistant to the ashing process, and thereby further reduces the effectiveness of the ashing process.

What is needed therefore, is a passivation and ashing process that more effectively removes the photoresist layer while adequately protecting the aluminum traces from corrosion and damage.

SUMMARY

The above and other needs are met by a method for forming a conductive trace on a substrate. The conductive trace is patterned with a photoresist mask and etched, thereby forming a polymer layer on a top surface and sidewalls of the photoresist mask and on sidewalls of the conductive trace. The polymer layer contains entrained chlorine gas. The substrate is heated on a chuck in a reaction chamber. A remote plasma is generated from ammonia gas and oxygen gas. The substrate is contacted with the ammonia and oxygen plasma, thereby withdrawing a substantial portion of the entrained chlorine gas from the polymer layer. A radio frequency potential is applied to the chuck on which the substrate resides, thereby creating a reactive ion etchant from the ammonia and oxygen plasma in the reaction chamber and removing the polymer layer from the top surface of the photoresist mask. The photoresist mask is thus exposed, and then removed in an ashing process.

By having no water vapor in the remote plasma used to withdraw the entrained chlorine gas, no corrosive chlorine solution is produced and thus no damage to the conductive trace occurs. Further, by applying the radio frequency potential to the chuck during the process, the polymer layer on at least the top surface of the photoresist mask is removed, thereby allowing for a faster and more complete removal of the photoresist mask during the ashing process. In this manner, a higher quality conductive trace is formed in a shorter period of time, thus improving the quality and reducing the cost of the integrated circuits that include such conductive traces.

In various preferred embodiments of the invention, the conductive trace comprises aluminum, which is etched with a reactive ion etch of chlorine and boron trichloride. The remote plasma is preferably generated using a microwave generator at a power of between about 500 watts and about 3000 watts, but may alternately be generated by an inductive coupling power source at a power of between about 200 watts and about 1500 watts.

The remote plasma may additional include nitrogen gas, hydrogen gas, argon gas, and a fluorinated hydrocarbon gas, where the fluorinated hydrocarbon gas is at least one of $C_xF_y$, $C_xH_yF_z$, and $NF_3$. Most preferably, the ratio of the ammonia gas to the oxygen gas in the remote plasma is adjusted to be between about 1:100 and about 10:1 to reduce and preferably minimize oxidation of the sidewalls of the conductive trace.

The exposed photoresist mask is preferably removed by ashing the photoresist mask with either a remotely generated microwave oxygen plasma or the remotely generated ammonia and oxygen plasma.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
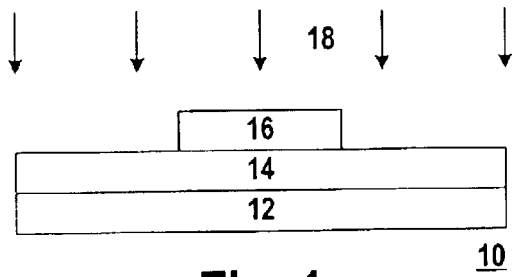
FIG. 1 is a cross sectional view of a masked conductive layer being etched.

With reference now to FIG. 1, there is depicted a cross sectional view of a portion of an integrated circuit 10, which is formed on a substrate 12. Disposed on the substrate 12 is a conductive layer 14, in which it is desired to form a conductive trace for electrically connecting various elements of the integrated circuit 10. In a most preferred embodiment, the conductive layer 14 is substantially formed of aluminum, which may have relatively thinner metallic layers disposed at least one of above or below it, for purposes as generally recognized in the art. Disposed on the conductive layer 14 is a photoresist mask 16, which has been patterned so as to define the conductive trace in the conductive layer 14 during an etching process.

Figure 2:
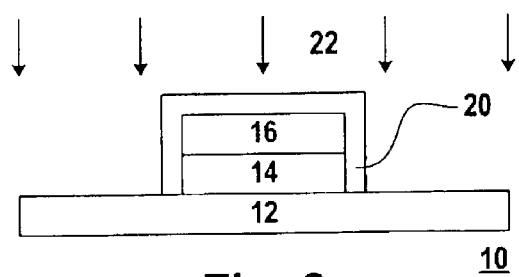
FIG. 2 is a cross sectional view of a polymer layer being treated.

Etchant 18 is most preferably a reactive ion etch using chlorine and boron trichloride plasma, which etches the exposed portions of the conductive layer 14, but does not appreciably etch either the photoresist mask 16 or the substrate 12. During the etching process as described above, a polymer layer 20 tends to form, as depicted in FIG. 2. FIG. 2 also depicts the conductive trace 14 after the etching process is complete. As described above, the polymer layer 20 interferes with the removal of the photoresist mask 16. However, prior art methods of removing or otherwise modifying the polymer layer 20 have also introduced problems in the past, as described above.

Therefore, as depicted in FIG. 2, a remote plasma 22 of ammonia and oxygen is formed and applied to the substrate 12 on which the conductive traces 14 have been etched, in a process that is called a passivation process, for convenience in referring to it herein. The ammonia and oxygen plasma 22 is preferably applied in a reaction chamber 26, such as is functionally depicted in FIG. 5. The reaction chamber 26 may be the same reaction chamber in which the etch process is performed. The substrate 12 preferably resides upon a heated chuck 28 during the passivation process.

The process gases, such as the ammonia and the oxygen, are preferably introduced from a gas source 32. In various alternate embodiments of the invention, the process gases also include one or more of nitrogen, hydrogen, argon, and a fluorinated hydrocarbon gas, such as $C_xF_y$, $C_xH_yF_z$, and $NF_3$. The ratio of the ammonia to oxygen in the process gas is preferably adjusted to be between about 1:100 and about 10:1, so as to reduce and preferably minimize the oxidation of the sidewalls of the conductive trace 14 during the passivation process.

Figure 5:
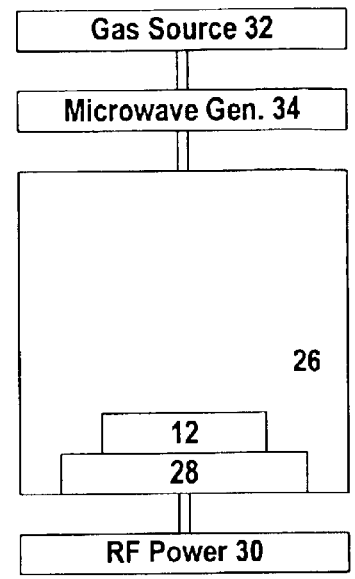
FIG. 5 is a functional representation of a preferred reaction chamber.
Figure 6:
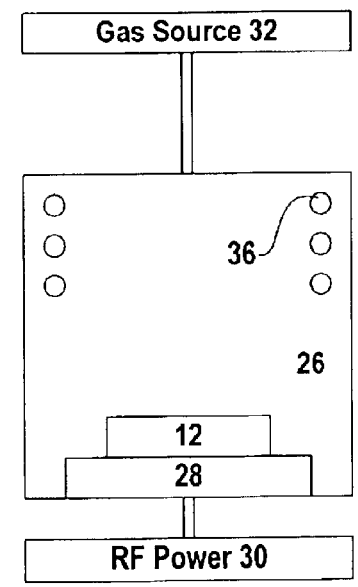
FIG. 6 is a functional representation of an alternate reaction chamber.

The remote plasma 22 is most preferably formed by a microwave generator 34 operating at a power of between about 500 watts and about 3000 watts, as depicted in FIG. 5. However, in an alternate embodiment the remote plasma 22 is formed by inductive coupling generated by coils 36, which are operated at a power of between about 200 watts and about 1500 watts.

Figure 3:
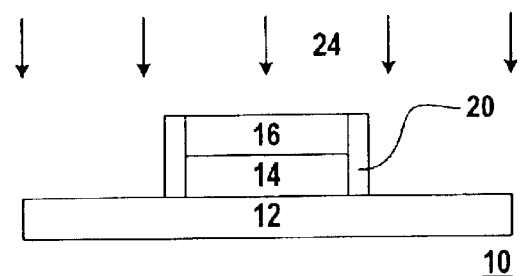
FIG. 3 is a cross sectional view of a photoresist mask being ashed.

A radio frequency power source 30 is preferable coupled to the heated chuck 28, and applies an RF power to the chuck of between about 50 watts and about 600 watts. This applied RF power induces a reactive ion etch using the remotely formed ammonia and oxygen plasma 22. By so doing, the polymer layer 20 on the top surface of the photoresist mask 16 is preferably removed, as depicted in FIG. 3, while at the same time the ammonia and oxygen plasma 22 preferably removes a substantial portion of the chlorine gas entrained in the polymer layer 20. However, because the process is conducted in an environment that is substantially free of water vapor, and more specifically within an environment in which no water vapor has been purposefully introduced at any point, the removed chlorine gas does not form the corrosive mixture that can damage the conductive trace 14.

Figure 4:
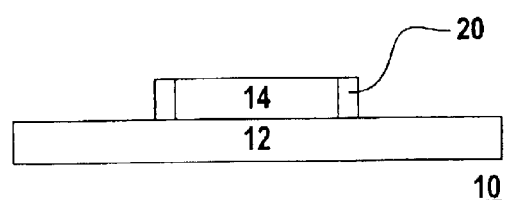
FIG. 4 is a cross sectional view of a conductive trace.

As depicted in FIG. 3, the photoresist mask 16 is preferably stripped in an ashing process with a remotely generated plasma 24. In a most preferred embodiment, the plasma 24 is the ammonia and oxygen plasma 22 of the passivation process, which is allowed to work for a longer period of time after the top surface of the polymer layer 20 has been removed. However, in alternate embodiments the plasma 24 is an oxygen plasma. The ashing process is most preferably accomplished in the same chamber 26 in which the etching and passivation processes are performed. However, as alluded to above, in alternate embodiments one or all of the processes may be accomplished in separate chambers. Following the ashing process, the conductive trace 14 appears as in FIG. 4. The polymer layer 20 preferably remains on the sidewalls of the conductive trace 14 to some degree during the processing, as it tends to protect the sidewalls of the conductive trace 14 from oxidation during the ashing process.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming a conductive trace on a substrate, the method comprising the sequential steps of:

patterning the conductive trace with a photoresist mask, etching the conductive trace, and thereby forming a polymer layer on a top surface and sidewalls of the photoresist mask and on sidewalls of the conductive trace, where the polymer layer contains entrained chlorine gas, moving the substrate, to a reaction chamber that is a different chamber from that in which the etching step was accomplished, heating the substrate on a chuck, generating a remote plasma from ammonia gas and oxygen gas using an inductive coupling generator, contacting the substrate with the ammonia and oxygen plasma, thereby withdrawing a substantial portion of the entrained chlorine gas from the polymer layer, applying a radio frequency potential to the chuck on which the substrate resides, thereby creating a reactive ion etchant from the ammonia and oxygen plasma in the reaction chamber and removing the polymer layer from the top surface of the photoresist mask, and thereby exposing the photoresist mask, and removing the exposed photoresist mask in an ashing process.

2. The method of claim 1, wherein the conductive trace comprises aluminum.

3. The method of claim 1, wherein the step of etching the conductive trace comprises etching the conductive trace with a reactive ion etch of chlorine and boron trichloride.

4. The method of claim 1, wherein the inductive coupling generator operates at between about 200 watts and about 1500 watts of power.

5. The method of claim 1, wherein the remote plasma further comprises nitrogen gas, hydrogen gas, argon gas, and a fluorinated hydrocarbon gas.

6. The method of claim 5, wherein the fluorinated hydrocarbon gas is at least one of $C_xF_y$, $C_xH_yF_z$, and $NF_3$.

7. The method of claim 1, further comprising the step of adjusting a ratio of the ammonia gas and the oxygen gas in the remote plasma to minimize oxidation of the sidewalls of the conductive trace.

8. The method of claim 7, wherein a ratio of the ammonia gas and the oxygen gas in the remote plasma is between about 1:100 and about 10:1.

9. The method of claim 1, wherein the stop of removing the exposed photoresist mask comprises ashing the photoresist mask with a remotely generated microwave oxygen plasma.

10. The method of claim 1, wherein the step of removing the exposed photoresist mask comprises ashing the photoresist mask with the ammonia and oxygen plasma.

11. A method for forming an aluminum trace on a substrate, the method comprising:

patterning the aluminum trace with a photoresist mask, etching the aluminum trace, and thereby forming a polymer layer on a top surface and sidewalls of the photoresist mask and on sidewalls of the aluminum trace, where the polymer layer contains entrained chlorine gas, heating the substrate on a chuck in a reaction chamber, generating a remote plasma from ammonia gas and oxygen gas in a ratio of between one of about 1:100 to 1:50, and about 10:1, contacting the substrate with the ammonia and oxygen plasma, thereby withdrawing a substantial portion of the entrained chlorine gas from the polymer layer, applying a radio frequency potential to the chuck on which the substrate resides, thereby creating a reactive ion etchant from the ammonia and oxygen plasma in the reaction chamber and removing the polymer layer from the top surface of the photoresist mask, and thereby exposing the photoresist mask, and removing the exposed photoresist mask in an ashing process.

12. The method of claim 11, wherein the step of generating the remote plasma comprises using a microwave generator.

13. The method of claim 11, further comprising the step of adjusting a ratio of the ammonia gas and the oxygen gas in the remote plasma to minimize oxidation of the sidewalls of the conductive trace.

14. The method of claim 11, wherein the step of removing the exposed photoresist mask comprises ashing the photoresist mask with the ammonia and oxygen plasma.

15. A method for forming an aluminum trace on a substrate, the method comprising:

patterning the aluminum trace with a photoresist mask, etching the aluminum trace, and thereby forming a polymer layer on a top surface and sidewalls of the photoresist mask and on sidewalls of the aluminum trace, where the polymer layer contains entrained chlorine gas, heating the substrate on a chuck in a reaction chamber, generating a remote plasma from ammonia gas and oxygen gas using a microwave generator, adjusting a ratio of the ammonia gas and the oxygen gas in the remote plasma to minimize oxidation of the sidewalls of the aluminum trace, contacting the substrate with the ammonia and oxygen plasma, thereby withdrawing a substantial portion of the entrained chlorine gas from the polymer layer, applying a radio frequency potential to the chuck on which the substrate resides, thereby creating a reactive ion etchant from the ammonia and oxygen plasma in the reaction chamber and removing the polymer layer from the top surface of the photoresist mask, and thereby exposing the photoresist mask, and removing the exposed photoresist mask in an ashing process.

16. The method of claim 15, wherein a ratio of the ammonia gas and the oxygen gas In the remote plasma is between about 1:100 and about 10:1.

* * * * *